US008035972B2

(12) United States Patent
Ostwald et al.

(10) Patent No.: US 8,035,972 B2
(45) Date of Patent: Oct. 11, 2011

(54) METHOD AND APPARATUS FOR LIQUID COOLING COMPUTER EQUIPMENT

(75) Inventors: Timothy C. Ostwald, Boulder, CO (US); Daniel J. Plutt, Superior, CO (US); Joseph P. Manes, Arvada, CO (US)

(73) Assignee: Oracle America, Inc., Redwood City, CA (US)

( * ) Notice: Subject to any disclaimer, the term of this patent is extended or adjusted under 35 U.S.C. 154(b) by 180 days.

(21) Appl. No.: 12/533,601

(22) Filed: Jul. 31, 2009

(65) Prior Publication Data
US 2011/0026225 A1 Feb. 3, 2011

(51) Int. Cl.
H05K 7/20 (2006.01)

(52) U.S. Cl. ............... 361/699; 165/80.4; 361/688

(58) Field of Classification Search .............. None
See application file for complete search history.

(56) References Cited

U.S. PATENT DOCUMENTS

| | | | | |
|---|---|---|---|---|
| 3,586,101 A | * | 6/1971 | Chu et al. | 165/101 |
| 3,609,991 A | * | 10/1971 | Chu et al. | 62/333 |
| 4,698,728 A | * | 10/1987 | Tustaniwskyj et al. | 361/699 |
| 5,299,278 A | | 3/1994 | Heller | |
| 5,323,847 A | * | 6/1994 | Koizumi et al. | 165/104.33 |
| 5,406,807 A | * | 4/1995 | Ashiwake et al. | 62/376 |
| 5,940,270 A | | 8/1999 | Puckett | |
| 6,029,742 A | | 2/2000 | Burward-Hoy | |
| 6,166,907 A | | 12/2000 | Chien | |
| 6,208,512 B1 | | 3/2001 | Goldowsky et al. | |
| 6,327,145 B1 | | 12/2001 | Lian et al. | |
| 6,393,853 B1 | * | 5/2002 | Vukovic et al. | 62/259.2 |
| 6,600,649 B1 | | 7/2003 | Tsai et al. | |
| 6,763,880 B1 | | 7/2004 | Shih | |
| 6,807,056 B2 | * | 10/2004 | Kondo et al. | 361/689 |
| 6,828,675 B2 | * | 12/2004 | Memory et al. | 257/714 |
| 7,402,804 B2 | * | 7/2008 | Frederick et al. | 250/361 R |
| 7,751,918 B2 | * | 7/2010 | Campbell et al. | 700/97 |
| 7,905,106 B2 | * | 3/2011 | Attlesey | 62/259.2 |
| 2003/0209343 A1 | | 11/2003 | Bingler | |
| 2010/0103618 A1 | * | 4/2010 | Campbell et al. | 361/699 |

FOREIGN PATENT DOCUMENTS

WO 0165900 9/2001

OTHER PUBLICATIONS

The Hot Aisle, http://www.thehotaisle.com/2009/06/03/ibm-claim-that-water-cooled-servers-are-the-future, Jun. 3, 2009.
"ZDNet Definition for: Water Cooled," http://dictionary.zdnet.com/definition/water+cooled.html, 2005.

* cited by examiner

Primary Examiner — Gregory Thompson
(74) Attorney, Agent, or Firm — Brooks Kushman P.C.

(57) ABSTRACT

A cooling system for cooling computer component with a liquid provided at atmospheric pressure, or low pressure, that flows through channel defined in the computer component. The liquid is pumped from a reservoir to a discharge port, or weir, that is located above the computer component. The liquid flows through an in-feed manifold to diverters that direct the liquid into in-feed tanks located above a row of the computer component. The liquid flows through the channels and flow control orifices to a drain that returns the liquid to the reservoir.

18 Claims, 6 Drawing Sheets

METHOD AND APPARATUS FOR LIQUID COOLING COMPUTER EQUIPMENT

BACKGROUND OF THE INVENTION

1. Field of the Invention

The present invention relates to a cooling system, a method, and an apparatus for liquid cooling an article of computer equipment.

2. Background Art

Computer equipment is generally assembled within an enclosure or to an open rack. Computer components, such as server blades, power supplies, switches and data storage modules, may be added or removed at will by a user to provide scalability for the system and field replacement of circuit components.

Computer components generally require cooling to operate at peak efficiency. Cooling for computer components is normally provided by circulating air that is driven by fans that circulate around the computer components. The air is then cooled by flowing through heat exchangers that are disposed adjacent to the computer components. Alternatively, the air circulating through the computer components may be cooled by the air conditioning system of a data center. As the number of computer components provided in electronics enclosures or racks increases, problems relating to cooling the components also increases. The cost of cooling a high-performance computing center increases the cost of operating the computing center.

Computer components are normally housed in enclosures have fans that blow air over hot circuits and then into the computer room or into an air-to-liquid heat exchanger. This approach creates a multi-step air-to-water-to-refrigerant cycle for expelling heat from the enclosure. Energy conversion inefficiencies are compounded by the use of air flow fans, heat exchanger grids and compressors. Air flow fans used to circulate air also consume power and generate additional heat that must be removed from the system.

High pressure liquid cooling systems have been developed in which high pressure water, for example water at 40 to 50 psi, may be pumped through a closed manifold including tubes and heat exchanger fins that are located adjacent to the computer components that require cooling. Such high pressure systems may require air flow fans that move air across the electronic components to absorb heat. The air then flows through heat exchanger fins that absorb heat from the air. The heat transferred to the fins of the heat exchanger is then absorbed by the high pressure liquid in the tubing and taken to a suitable chiller or cooling system that removes the heat from the system. Other high pressure liquid cooling systems directly cool electronic components by circulating liquid through tubes or conduits without using an air heat exchange interface.

The cost of operating a high pressure liquid system may be substantial in a high performance computing environment. High performance computing environments may have numerous racks that each require various quantities of cooling capacity. For example, 64 components may be configured per rack that may require dissipation of as much as 50,000 watts of heat into the computer environment per rack. Cooling such a large number of computer components consumes power for cooling the components on the racks and adds to the total cost of operating the data center.

Pressurized liquid cooling systems for electronics enclosures are subject to pressure variations. Adding and removing modules from the system may affect the head pressure or flow of water through the system. Pressurized systems are subject to variation due to pump performance, electrical control variations, and pressure variations caused by adding or removing components from the system. Higher pressure systems may stress liquid connections and be more prone to development of leaks. Higher cost components of a high pressure cooling circuit increase the cost of the cooling system.

The method and apparatus summarized and described below is directed to solving the above problems.

SUMMARY OF THE INVENTION

According to one aspect of the present disclosure, a non-pressurized system, or low pressure system, is disclosed for cooling computer components.

A supply of coolant is provided at atmospheric or low pressure to an inlet side of the computer equipment that is circulated through tubing and channels formed in thermally conductive jackets that are assembled to computer equipment modules. (As used herein, the term low pressure should be understood to be less than 5 psi.) The coolant flows through the computer equipment modules and is drained from the modules to an open system that is maintained at atmospheric pressure.

In one embodiment, both the liquid inlet and liquid outlet sides of the system are open to atmospheric pressure. A liquid coolant is provided to the top of the cabinet or rack and is distributed in a controlled fashion down a vertical distribution manifold to a plurality of vertically spaced in-feed branches. A constant supply of water is provided at a low pressure, or at atmospheric pressure, at each level of the distribution system. The in-feed branches may function as holding tanks for the liquid. The liquid flows through channels that are provided at locations adjacent to the electronic components to be cooled. Liquid flowing through the channels absorbs heat directly from the electronic components and is ported to a drain branch or drain that removes the liquid from the electronic components. The liquid may be returned to the reservoir from which the coolant liquid was initially pumped in a closed loop system. The coolant liquid in the reservoir may be circulated to a coolant loop of a chiller or building coolant system.

Several advantages may be directly achieved as a result of providing a low pressure (gravity based) cooling system. Pressure causing liquid flow is limited and does not vary with the addition or removal of components that must be cooled in the system. The addition or removal of an electronics module will not affect head pressure or the flow of liquid to other modules because the in-feed branches function as holding tanks that are open to atmospheric pressure, or at low pressure. As water in the in-feed branches flows through the system, additional water flows by gravity to replenish the supply.

The disclosed low pressure system does not require high pressure pumps that may vary depending upon pump speed or size. The low pressure also is not subject to electrical control variations.

Another advantage of using a low pressure liquid cooling circuit is that liquid connections are less prone to leakage and are consequently more reliable. Low pressure liquid connections are also less expensive than high pressure fluid connections.

Another aspect of this disclosure relates to providing a cooling system for a computer components on a computer equipment rack, or the like. Liquid is provided to the computer components at atmospheric, or at low pressure. Each computer card defines a plurality of channels that receive the liquid from the branch tank and directs the liquid around the electronic components to transfer heat from the electronic components to the liquid. A drain branch or other conduit that is maintained at atmospheric pressure receives the liquid from the channels.

According to other aspects of the cooling system, a reservoir may be provided that contains a liquid that is pumped to a discharge port, or weir, located above the computer equipment rack. A coolant feed manifold may receive liquid from the weir and directs the liquid by gravity flow to fill at least one branch tank that is disposed above at least one computer equipment card. The branch tank may be open to atmospheric pressure or otherwise maintained at low pressure. Similarly, the drain branch may also be simply maintained at atmospheric pressure. In this way, a balanced flow of coolant is provided to the computer equipment that is not effected by changes in the number of components to be cooled or other variations in the system.

According to another aspect of this disclosure, a method is provided for cooling computer equipment. The method includes providing a liquid to a circuit board that includes at least one channel, but preferably several channels, directing the liquid around the electronic components and transferring heat from the electronic components to the liquid. The liquid is ported from the channel to a manifold that is maintained at atmospheric pressure.

According to other aspects of the method, method may include pumping the liquid from a reservoir of cooling liquid to a weir, or discharge port. The liquid over-flows the weir into a vertical feed conduit and feeds the liquid from the vertical feed conduit to a diverter. The liquid is diverted from the vertical feed conduit to a tank that is open to atmospheric pressure. The method may also include the step of restricting the flow of liquid to reduce noise by providing a porous member in the vertical feed conduit through which the liquid flows. Further, during the porting step, the flow of liquid from the channels may be adjusted to control the rate at which the liquid drains from the channel depending upon the cooling requirements of the components to be cooled. The method may also include the step of venting air from above the tank to maintain atmospheric pressure. The liquid may also be circulated from an external cooling system, such as a chiller or cooling tower, to maintain the temperature of the liquid in the reservoir at a relatively cool temperature.

According to another aspect of the disclosure, an article of computer equipment is provided that includes a rack and a plurality of spaced rows of computer components that are assembled to the rack. The cooling system includes a reservoir for a cooling liquid and a pump that pumps the liquid from the reservoir to a discharge port disposed above the rack. A feed column receives the liquid from the discharge port and directs the downward flow of the liquid. A first branch tank may be provided that is maintained at atmospheric pressure and is disposed above a first row of computer components. The first row of computer components may define a plurality of channels that receive the liquid from the first branch tank and direct the liquid around the electronic components. Heat is transferred from the electronic components through the channels and to the liquid. The second branch tank is maintained at atmospheric pressure and is disposed above a second row of computer components. The second row of computer components defines a second plurality of channels that receive liquid from the second branch tank and direct the liquid around the second row of electronic components to transfer heat from the electronic components to the liquid. A drain column is provided that receives liquid from the channels to be returned to the reservoir.

According to other aspects of the article, the article may further include a first liquid conduit that receives liquid from the first set of channels that drains to the drain column. The second liquid conduit receives liquid from the second set of channels and also drains into the drain column. An orifice may be provided in each of the channels to control the flow of liquid through the channels and into the drain conduits. The size of the orifice provided in each of the channels is determined according to the cooling requirements of the computer components that are to be cooled. A diverter may be provided in the feed column that function to provide liquid to each of the branch tanks. Once the branch tank is full, the liquid continues to collect in the diverter until it reaches an over-flow level partition and flows into the feed column and downwardly to the next diverter or to the reservoir.

The preceding advantages and objects summarized above will be better understood in view of the attached drawings and the following detailed description of the preferred embodiment.

DETAILED DESCRIPTION OF THE ILLUSTRATED EMBODIMENT

Figure 1:
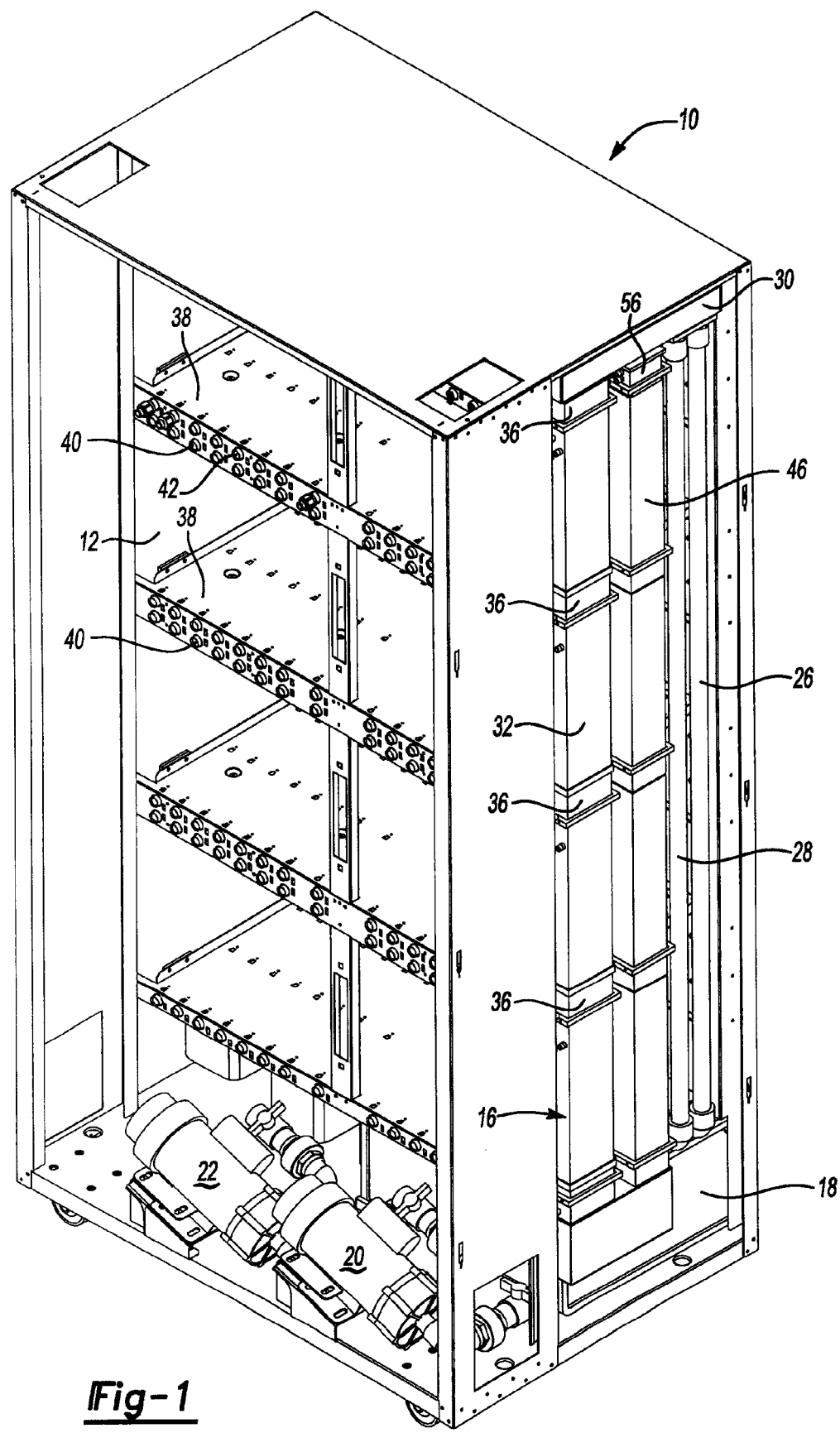
FIG. 1 is a perspective view of a computer equipment enclosure including a rack having multiple levels for supporting a plurality of computer components and a cooling system made according to one embodiment of the present invention.
Figure 2:
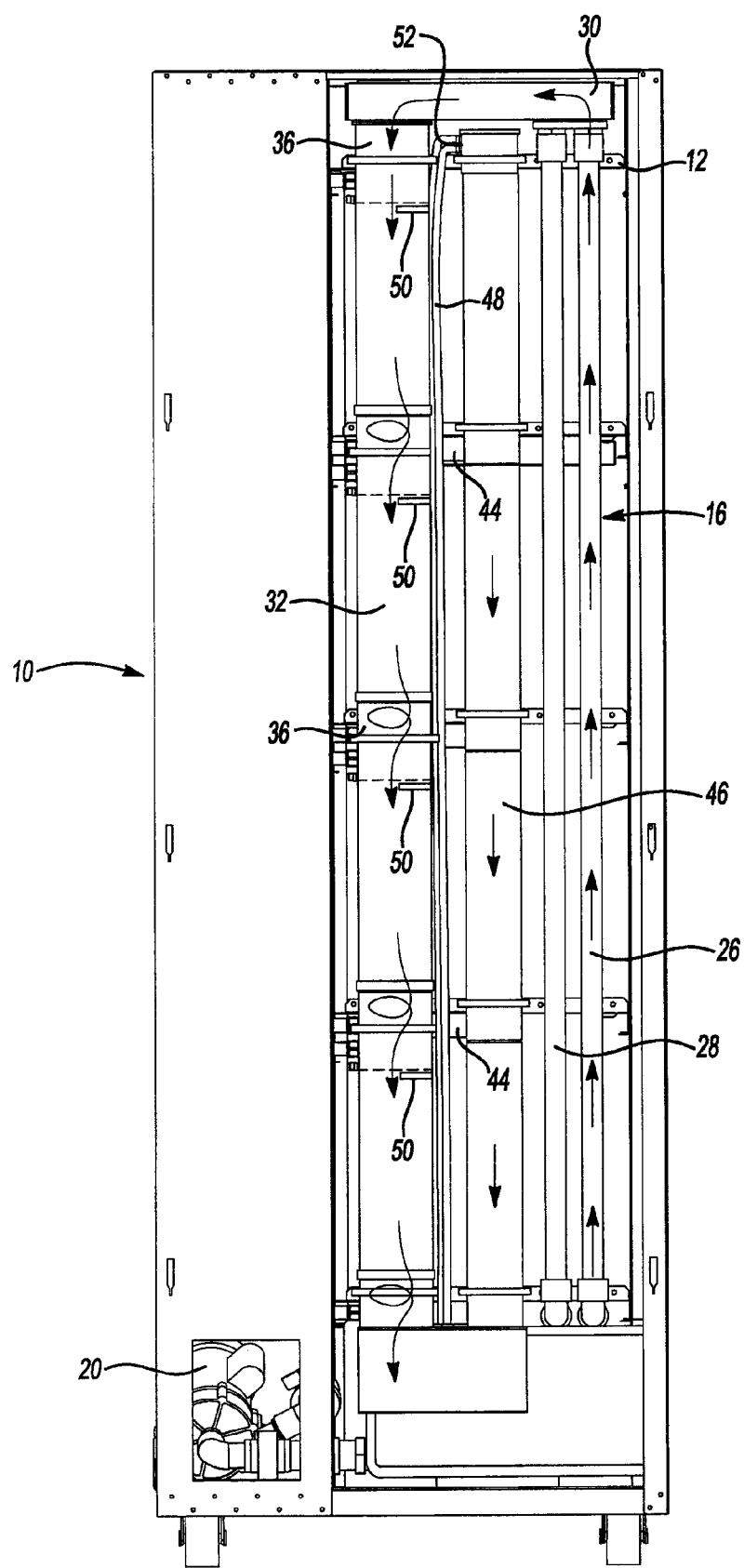
FIG. 2 is a side elevation view of the computer equipment enclosure and cooling system shown in FIG. 1.

Referring to FIGS. 1-4, an enclosure 10 is shown in FIGS. 1 and 2 that encloses a rack 12 for computer components. A cooling system 16 is shown in association with the enclosure 10 that is used to cool computer components (not shown in FIGS. 1 and 2) that are disposed on the rack 12.

The cooling system 16 includes a reservoir 18 for a liquid, such as water or another coolant. A pump 20 draws liquid from the reservoir 18. An auxiliary pump 22 is provided in the event that the pump 20 fails or requires service and thereby assures that an adequate supply of coolant is circulated through the cooling system 16. The pump 20 pumps the liquid through a supply pipe 26 upwardly to a point near the top of the enclosure 10. An auxiliary supply pipe 28 receives the cooling liquid from the auxiliary pump 22, if necessary. The supply pipe 26 provides water to a discharge port chamber 30 at the outlet end of the supply pipe 26. The auxiliary supply pipe 28 also opens into the discharge port chamber 30. Water flows from the supply pipe 26 that essentially forms a weir, or an over-flowing port, into the discharge port chamber 30. The liquid flows across the discharge port chamber 30 and into a distribution column 32, or manifold. The liquid flows downwardly through the distribution column 32.

Figure 3:
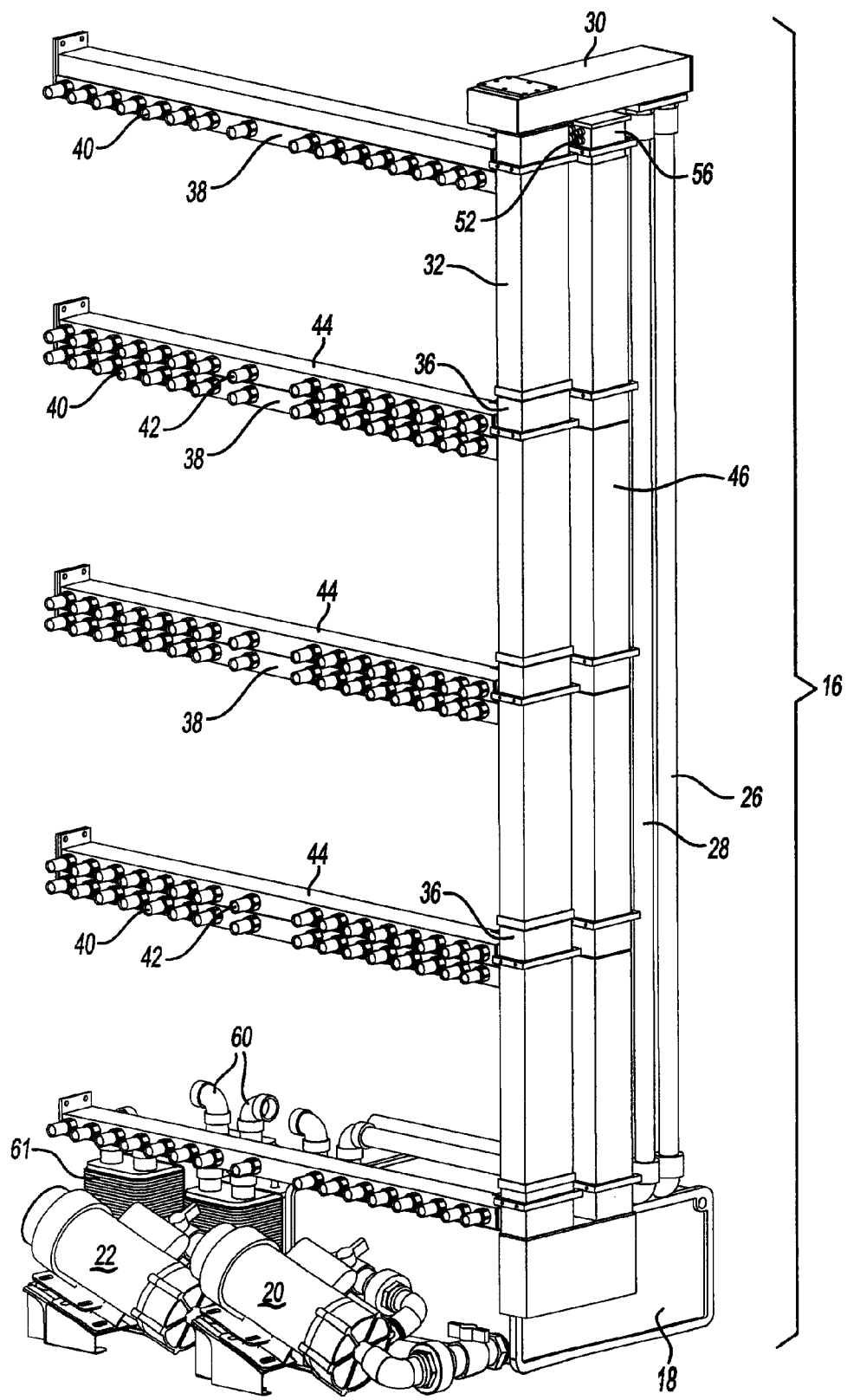
FIG. 3 is a perspective view of the cooling system shown in isolation.
Figure 4:
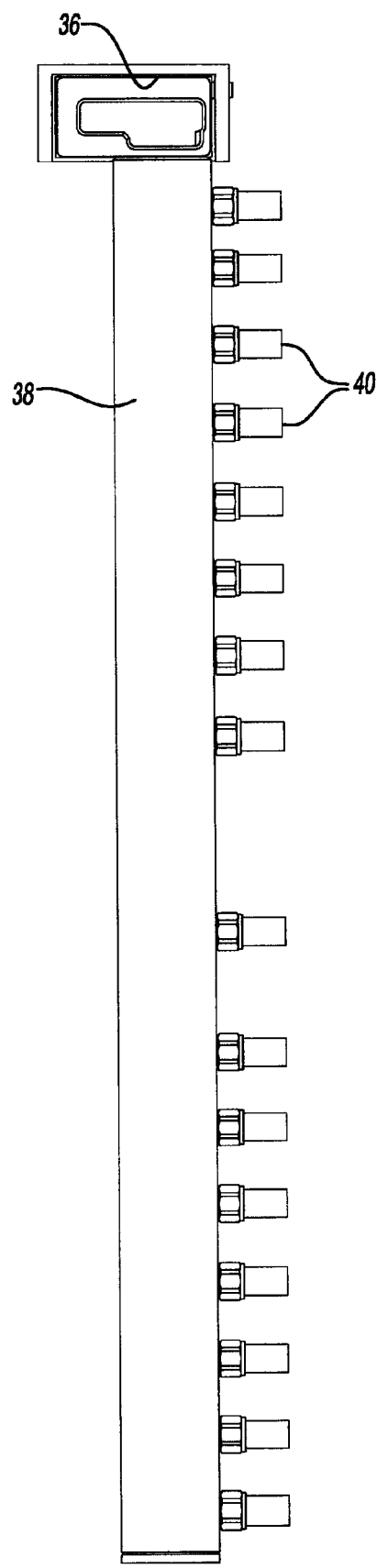
FIG. 4 is a top plan view of a branch tank with a diverter and a plurality of quick connect supply ports.

A plurality of water flow diverters 36 are provided at spaced locations along the distribution column 32. The liquid flow diverters 36 divert a portion of the water flowing through the distribution column 32 into a plurality of branch tanks 38. The branch tanks 38 are shown in FIGS. 3 and 4. The branch tanks 38 provide the liquid through quick connect supply ports 40 to computer components (not shown in FIGS. 1-4). An example of a computer component is described with reference to FIG. 7 below.

Cooling liquid exits the computer components through quick connect drain ports 42. The drain ports 42 drain the liquid into a drain conduit 44 that causes the liquid to flow into the drain column 46. Liquid in the drain column 46 flows downwardly into the reservoir 18.

Referring to FIG. 2, a vent pipe 48 may be provided at various locations in distribution column 32. Preferably, the vent pipes 48 are provided below the liquid flow diverters 36 to assure that the pressure in the distribution column 32 remains at atmospheric pressure. It should be understood that a small amount of pressure could be provided in the branch tanks 38, for example, one to two psi. However, in the illustrated embodiment, the branch tanks 38 are maintained at atmospheric pressure. The vent pipes 48 are connected to branch tube vents 50 that vent the distribution column 32 at spaced locations to assure that the pressure within the distribution column 32 remains at approximately atmospheric pressure. A plurality of vent pipes 48 are connected by a manifold 52 to a breather filter 56 located at the top of the drain column 46. The breather filter 56 is open to atmosphere and also may provide humidity control.

Referring to FIG. 3, cooling loop piping 60 and appropriate fittings may be used to circulate water from an external chiller or cool water source to the reservoir 18 to maintain the temperature of the liquid circulating through the cooling system 16 at a cool temperature relative to the liquid in the reservoir 18. A heat exchanger 61 is provided to transfer heat from the cooling system 16 to the cooling loop piping 60 that is part of an external cooling system such as a house cooling system or external chiller (not shown). Alternatively, the heat exchanger 61 can be eliminated and the cooling system 16 could be ported to the house cooling system or chiller loop. If the heat exchanger 61 is eliminated, pressure relief valves (not shown) should be incorporated in the external cooling system.

Referring to FIG. 4, a sub-assembly including a branch tank 38, a plurality of quick connect supply ports 40 and liquid flow diverters 36 are shown assembled together. The branch tank 38 receives the liquid through the liquid flow diverters 36 on one or both ends to provide cooling liquid through the quick connect supply ports 40.

Figures 5, 6:
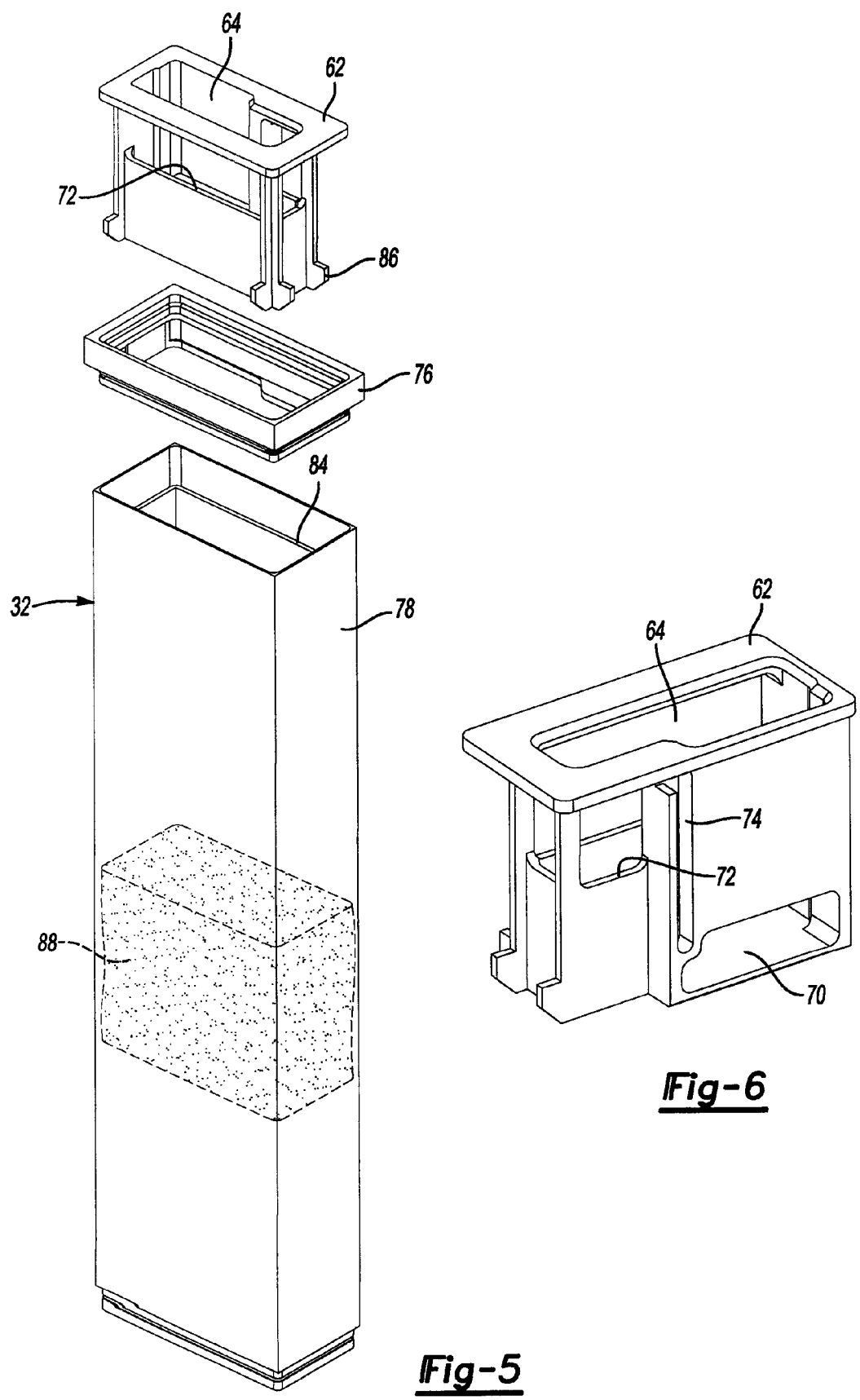
FIG. 5 is an exploded perspective view of a diverter and distribution column segment.
FIG. 6 is a perspective view of a diverter insert.

Referring to FIGS. 5 and 6, a diverter insert 62 is illustrated in conjunction with a portion of the distribution column 32. The diverter insert 62 includes an upper inlet opening 64 through which water flows from the distribution column 32. Water in the diverter inserts 62 flows through diverter inserts 62 to a branch supply outlet 70 located at the lower end of the diverter inserts 62. A plurality of spill-over walls 72 are provided around a portion of the periphery of the diverter inserts 62. When water fills the diverter inserts 62 to the level of the spill-over walls 72, additional water spills over the walls 72 and downwardly toward the next sequential diverter 36 or the reservoir 18.

In FIG. 5, the diverter insert 62 is shown in conjunction with a distribution column segment 78. The construction of the diverter and the distribution column is modular so that the desired number of diverters 36 may be assembled with a distribution column segments 78 to provide a column 32 of the desired height. A branch air vent 74 is open on its lower end to the interior of the branch tank 38 that receives water through the branch supply outlet 70. The branch air vent 74 ports air from its associated branch tanks 38 to assure that the branch tanks 38 are completely filled and to prevent any build-up of pressure or vacuum within the branch tanks 38.

A collar 76 may be used to secure the diverter insert 32 within the distribution column segment 78. A recess 84 may be formed within the column segment 78 that may support the collar 76 and in turn supports the diverters 36 within the distribution column segment 78. The diverter may be provided with spacers 86 that stabilize the diverter insert 62 relative to the end of the distribution column segment 78.

A porous foam block 88 may be provided within the distribution column 32 and is shown in the distribution column segment 78 illustrated in FIG. 5. The porous foam block 88 reduces turbulence and noise, but allows water and air to pass through the distribution column 32. In the illustrated embodiment, pressure within the distribution column segment 78 is maintained at atmospheric pressure by the operation of the branch tube vent 50 and the vent pipe 48 that is shown in FIG. 2.

Figure 7:
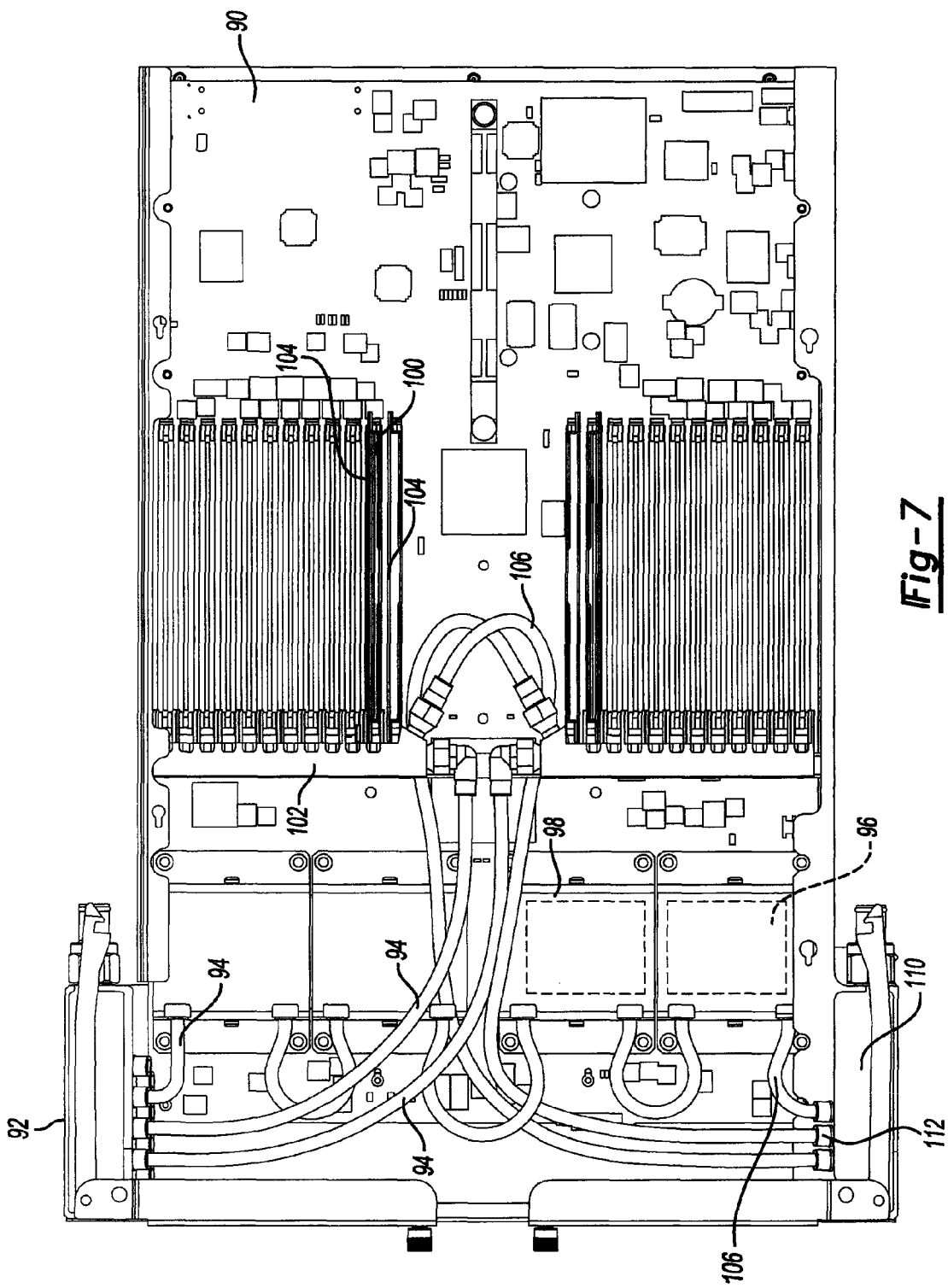
FIG. 7 is a side elevation view of a server card which is shown as an example of a computer component that may be installed in the enclosure illustrated in FIG. 1 and is adapted to be cooled by the cooling system.

Referring to FIG. 7, a server card 90 is illustrated as an example of a computer component that may be received on the electronics rack 12 provided in the enclosure 10 that is shown in FIG. 1. The server card 90 is only one example of a computer component that may be received in the rack 12. Other examples of computer components may include power supplies, switches, data storage modules, and the like that include components that must be cooled in the normal course of operation.

The server card 90, or other computer component, may be provided with a coolant supply manifold 92 that receives coolant from the quick connect supply ports 40 of the branch tank 38. Liquid flows from the coolant supply manifold 92 through coolant supply tubes 94 to electronic components that require cooling, such as microprocessors 96. Jackets 98 may be provided around electronic components such as microprocessors 96 that either direct liquid around the microprocessors 96 or conducts heat through the metallic body of the jackets 98 to liquid conduits provided within the jackets 98. Other coolant supply tubes 94 may be provided to cool memory chips 100. The memory chips 100 may be cooled by liquid flowing through a coolant manifold block 102, as shown, that is connected to a plurality of fins 104 that flank the memory chips 100. The liquid is removed through coolant drain tubes 106 to a coolant drain manifold 110 after the liquid flows through the coolant manifold block 102 or the jackets 98.

The coolant drain manifold 110 may be partially filled with liquid and partially filled with air that is maintained at atmospheric pressure as a result of venting through the drain conduit 44 and drain column 46. By maintaining the coolant drain manifold 110 at atmospheric pressure, a self-regulating system may be provided wherein liquid flowing through the server card 90 flows via gravity through the card 90 with minimal back pressure. While certain electronic components are shown to be cooled on the server card, it should be understood that other components may be cooled in a similar manner using different types of jackets and fins that remove heat from the electronic components and transfer the heat to the liquid flowing through the cooling system 16.

An orifice valve 112 may be provided as part of the coolant drain manifold 110 that may be adjusted to control the flow of liquid from the server card 90 or other computer components to the drain conduit 44. If a component, such as the power supply or microprocessor, requires a large quantity of cooling, the orifice may be opened to increase the flow of liquid around the computer components. Components requiring less cooling capacity may be provided with a smaller orifice so that adequate cooling is provided to a wide range of electronic components while maximizing system efficiency.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A cooling system for an electronics rack, the cooling system comprising:
   a reservoir containing a cooling liquid;
   a pump that pumps the cooling liquid from the reservoir to a discharge port above the electronics rack;
   a distribution manifold that receives the liquid from the discharge port and directs the liquid by gravity flow to fill a branch tank;
   an electronics module defining a plurality of channels that receive the cooling liquid from the branch tank that is disposed above the electronics module and that is open to atmospheric pressure, wherein the channels direct the liquid around a plurality of electronic components on the electronics module to transfer heat from the electronic components to the liquid; and
   a drain at atmospheric pressure that receives the liquid from the channels.

2. The cooling system of claim 1 wherein the distribution manifold further comprises a diverter that provides the liquid to the branch tank to fill the branch tank.

3. The cooling system of claim 2 wherein a plurality of diverters are provided and wherein each diverter collects the liquid in a first chamber that flows into a branch tank that is one of a plurality of branch tanks, after each branch tank is full, the liquid continues to collect in the first chamber until it reaches an over flow level partition and flows into the distribution manifold and to one of a plurality of electronics modules that are vertically arranged from a highest electronics module to a lowest electronics module, until the diverter associated with a lowest electronics module is reached and the liquid reaches the overflow partition of the diverter associated with the lowest electronics module and flows to the reservoir.

4. The cooling system of claim 1 wherein the electronics module is one of a plurality of the electronics modules that are provided in a vertical stack, and wherein liquid flows through the distribution manifold to the channels defined in each of the electronics modules in the vertical stack.

5. The cooling system of claim 1 wherein volumetric flow of liquid through the channels in the electronics module is controlled by the size of an orifice, wherein the size of the orifice is determined according to the cooling requirements of the electronic components on the electronics module that are to be cooled.

6. The cooling system of claim 1 further comprising a porous member disposed in the distribution manifold to limit the rate of the flow of liquid downwardly through the distribution manifold.

7. A method of cooling computer equipment comprising:
   providing a reservoir;
   pumping a liquid from the reservoir to a discharge port;
   directing the liquid overflowing the discharge port to a vertical feed conduit;
   directing the liquid from the vertical feed conduit with a diverter to a tank that is open to atmospheric pressure;
   porting the liquid from the tank to a computer component that has a plurality of channels through which the liquid flows primarily as a result of gravity around a plurality of electronic components to transfer heat from the electronic components to the liquid; and
   draining the liquid from the channels.

8. The method of claim 7 wherein the vertical feed conduit is provided with a porous member and the step of directing the liquid with the diverter further comprises causing the liquid to flow through the porous member disposed in a vertical feed conduit.

9. The method of claim 7 further comprising:
   overflowing the liquid from the diverter into the vertical feed conduit to a second diverter;
   directing liquid from the second diverter to a second tank that is open to atmospheric pressure;
   porting the liquid to a second computer component that has a plurality of channels in the second component that directs the liquid around a second plurality of electronic components on the second computer component to transfer heat from the electronic components on the second circuit board to the liquid;
   draining the liquid from the channels in the second computer component to a second drain;
   maintaining the second drain at atmospheric pressure; and
   circulating the liquid from the second drain to the reservoir.

10. The method of claim 9 further comprising restricting the flow of the liquid in the porting step to control the rate at which the liquid drains from the channels.

11. The method of claim 7 replenishing the liquid in the tank with liquid flowing from the diverter to continually cool the liquid in the tank.

12. The method of claim 7 wherein the draining step further comprises draining a branch of a drain manifold into a vertical drain conduit that directs the liquid into the reservoir.

13. An article of computer equipment comprising:
    a rack;
    a plurality of rows of computer components that are assembled to the rack in a vertically spaced arrangement;
    a cooling system including:
      a reservoir containing a liquid;
      a pump that pumps the liquid from the reservoir to a discharge port disposed above the rack;
      a feed column that receives the liquid from the discharge port and directs the downward flow of the liquid;
      a first branch tank that is maintained at low pressure, receives liquid from the feed column, and is disposed above a first row of computer components;
      the first row of computer components defining a first set of channels that receive the liquid from the first branch tank and direct the liquid around the first row of electronic components to transfer heat from the electronic components to the liquid;
      a second branch tank that is maintained at low pressure, receives liquid from the feed column, and is disposed below the first branch tank and above a second row of computer components;
      the second row of computer components defining a second set of channels that receive the liquid from the second branch tank and direct the liquid around the second row of electronic components to transfer heat from the second row of electronic components to the liquid; and
      a drain column that is maintained at atmospheric pressure that receives the liquid from the second set of channels and returns the liquid to the reservoir.

14. The article of computer equipment of claim 13 further comprising a first liquid drain branch that receives the liquid from the first set of channels that drains into the drain column, and a second liquid drain branch that receives the liquid from the second set of channels that drains into the drain column.

15. The article of computer equipment of claim 13 further comprising an orifice associated with each of the channels that control the flow of liquid through the channels, wherein the size of the orifice provided is determined according to the cooling requirements of the computer components that are to be cooled.

16. The article of computer equipment of claim 13 further comprising a porous member disposed in the feed column that limits the rate of the flow of liquid downwardly through the feed column.

17. The article of computer equipment of claim 13 further comprising a plurality of diverters through which the liquid flows from the feed column, wherein each diverter provides the liquid to one of the branch tanks.

18. The article of computer equipment of claim 17 wherein each diverter collects the liquid in a first chamber, the liquid flows from the first chamber into one of the branch tanks, and once the branch tank is full, the liquid continues to collect in the first chamber until the liquid reaches an over flow level partition of the diverter over which the liquid flows into the feed column.

* * * * *